US007106093B2

(12) United States Patent
Suzuki

(10) Patent No.: US 7,106,093 B2
(45) Date of Patent: Sep. 12, 2006

(54) SEMICONDUCTOR DEVICE

(75) Inventor: Yasuyuki Suzuki, Tokyo (JP)

(73) Assignee: NEC Corporation, (JP)

( * ) Notice: Subject to any disclaimer, the term of this patent is extended or adjusted under 35 U.S.C. 154(b) by 0 days.

(21) Appl. No.: 10/530,888

(22) PCT Filed: Oct. 6, 2003

(86) PCT No.: PCT/JP03/12789

§ 371 (c)(1), (2), (4) Date: Apr. 11, 2005

(87) PCT Pub. No.: WO2004/034575

PCT Pub. Date: Apr. 22, 2004

(65) Prior Publication Data

US 2006/0114016 A1 Jun. 1, 2006

(30) Foreign Application Priority Data

Oct. 10, 2002 (JP) ............................ 2002-296982
Jul. 11, 2003 (JP) ............................ 2003-273220

(51) Int. Cl.
*H03K 17/16* (2006.01)
*H03K 19/003* (2006.01)
*H03K 19/20* (2006.01)
*H03K 19/094* (2006.01)

(52) U.S. Cl. ............................ 326/30; 326/26; 326/27; 326/28; 326/29; 326/115; 326/116; 326/117; 326/118; 326/119; 326/120; 326/121; 326/122; 326/123; 326/124; 326/125; 326/126; 326/127; 326/128; 326/129; 333/32

(58) Field of Classification Search ............ 326/26–30, 326/82, 83, 115–129; 333/32
See application file for complete search history.

(56) References Cited

U.S. PATENT DOCUMENTS 5,099,152 A * 3/1992 Suzuki .......................... 326/3
5,111,080 A * 5/1992 Mizukami et al. ............ 326/30
6,046,653 A * 4/2000 Yamada ....................... 333/32
6,781,404 B1 * 8/2004 Suzuki et al. ................. 326/30
6,784,674 B1 * 8/2004 Miller ........................ 324/754

FOREIGN PATENT DOCUMENTS

JP 5-48350 A 2/1993
JP 5-62844 B2 9/1993
JP 2503913 B2 6/1996
JP 10-84260 A 3/1998
JP 11-220336 A 8/1999
JP 11-297936 A 10/1999

* cited by examiner

OTHER PUBLICATIONS

A copy of the International Search Report issued for the parent PCT application, no month and date.

*Primary Examiner*—Rexford Barnie
*Assistant Examiner*—Jason Crawford
(74) *Attorney, Agent, or Firm*—Dickstein, Shapiro, LLP.

(57) ABSTRACT

A semiconductor device having a plurality of cascaded IC's (14, 15, 16), wherein the matching impedance between a signal transmission path (12) connected to an external signal transmission path and an input-side or output-side IC (14, 16) is set at 50 ohms which is equal to the characteristics impedance of the external signal transmission path. The matching impedance between a internal signal transmission path (13) and an input-side or output-side IC or intermediate IC is set at 200 ohms which is higher than the 50 ohms. The semiconductor device reduces the current dissipation and can operate at a higher speed.

25 Claims, 9 Drawing Sheets

R31=R32=R33=R34=Z=50Ω

SEMICONDUCTOR DEVICE

This application is a 371 of PCT/JP03/12789 filed on Oct. 6, 2003.

TECHNICAL FIELD

The present invention relates to a semiconductor device having a plurality of semiconductor integrated circuits (ICs) such as an MCM (Multi Chip Module), and more particularly, to a semiconductor device having an input impedance matched to the impedance of an external circuit and capable of performing a high-speed operation.

BACKGROUND ART

Together with a recent tendency of higher degree of integration density of semiconductor devices, there has been an increasing demand for a higher-speed operation. In an optical communication system, for example, data transfer rate has been significantly increased and data transfer rates of 2.4 Gbps and 10 Gbps have already been realized in practical use. In the future, the data transfer rate is expected to be increased more and more.

As the operational speed of the semiconductor device becomes higher, it is impossible to ignore the presence of a reflected signal generated in a transmission path that connects together interconnections within a semiconductor integrated circuit (IC) or connects the semiconductor IC with another semiconductor IC. Therefore, a technique of impedance matching is used in a portion having a long interconnection or long transmission path.

FIG. 9 shows the configuration of a module in a conventional semiconductor device. A semiconductor device 21 has input/output connectors 27 connected to an external circuit. Each terminal of the connector 27 is connected to a corresponding input/output transmission path 22. Disposed on a mounting substrate/board 28 are a plurality of cascaded IC chips. More specifically, an input-side IC chip 24 and an output-side IC chip 26, which are connected to the input/output transmission paths 22, and the intermediate IC chips 25 are disposed on the mounting substrate/board 28. Each adjacent two of the IC chips disposed are connected together by one or more internal transmission paths 23 formed on the mounting substrate/board 28. Each of the connectors 27 is connected to a coaxial cable (not shown), through which a signal is exchanged between the semiconductor device 21 and the external circuit. Here, a propagation in the coaxial transmission path will be described. Attenuation constant $\alpha$ is represented by the following equation:

$$\alpha = \frac{1}{4\pi}\frac{Rs}{\sqrt{\frac{\mu_0}{\varepsilon}\ln\frac{D}{d}}} = \left(\frac{1}{d}+\frac{1}{D}\right) \quad (1)$$

where d is the outer diameter of a central conductor, D is the inner diameter of an outside conductor, $\epsilon$ is the dielectric constant of insulator, Rs is the surface resistance, and $\mu_0$ is the magnetic permeability of vacuum.

A smaller value of the $\alpha$ reduces the attenuation in the coaxial transmission path. In the above equation (1), from the view point of the relation between the ratio of D to d and $\alpha$, if D/d=3.59, then $\alpha$ assumes a minimum value. The characteristic impedance of the coaxial cable is represented by the following equation:

$$Z_0 = \frac{60}{\sqrt{\varepsilon_r}}\ln\frac{D}{d} \quad (2)$$

where $\epsilon_r$ is the relative dielectric constant of insulator.

The coaxial cable uses polyethylene resin ($\epsilon_r$=2.3) as an insulator to support the central conductor. When this relative dielectric constant is assigned to the coaxial cable using the support for the central conductor, the characteristic impedance is about 50 Ω (ohms) at the point of D/d=3.59, where the attenuation constant assumes the minimum value. Therefore, the external impedance is generally set at 50 ohms. The characteristic impedance of the input/output transmission path 22 is accordingly set at 50 ohms in order to achieve the impedance matching to the external impedance. At the same time, the characteristic impedance of the internal transmission path 23 is also set at 50 ohms. The input/output impedance of the ICs (24 to 26) that perform a high-speed operation is also set at 50 ohms.

In the conventional technique, in order to set the input/output impedance of IC at 50 ohms, the input circuit of the IC is connected to a matching resistor of 50 ohms and, at the same time, the output circuit of the IC is also connected to another matching resistor of 50 ohms. Therefore, the output transistor of the IC is driven by a low load resistance. In the IC to which an output signal from the output transistor is input, the amplitude of the input signal is defined in order to guarantee a normal operation of the IC on the signal input side. The output transistor on the preceding-stage IC operates to meet the defined amplitude. However, being connected to a low load resistance as described above, the output transistor needs to be driven with a large current in order to meet the requirement. As a result, the following problems have arisen:

(1) The current dissipation of the ICs (24 to 26) and semiconductor device (21) is increased because the output transistor is driven with a large current.

(2) The size of the IC should be increased because the size of the output transistor needs to be increased.

(3) The current dissipation and the area of the IC are increased more and more because the number of stages or the size of the buffer circuit for driving the output transistor is increased.

DISCLOSURE OF THE INVENTION

In order to solve the problems in the conventional technique as described above, it is an object of the present invention to provide a higher-speed and lower-power-dissipation semiconductor device in which the impedance matching between the input/output of the IC chip and the transmission path on the mounting substrate/board is achieved so as not to generate a signal reflection or signal loss even in a higher-speed operation, to thereby reduce the output drive current of the IC chip.

The present invention provides, in a first aspect thereof, a semiconductor device including a plurality of ICs including at least an input-stage IC and an output-stage IC, and signal transmission paths that connect each two of the plurality of ICs to achieve impedance matching therebetween, characterized in that: an input impedance of the input-stage IC and an output impedance of the output-stage IC are equal to a first impedance; and each of at least two of the plurality of ICs is impedance-matched to a corresponding one of signal transmission paths at a matching impedance which is higher than the first impedance.

The present invention also provides, in a second aspect thereof a semiconductor device including a plurality of ICs including at least an input-stage IC and an output-stage IC, and signal transmission paths that connect each adjacent two of the plurality of ICs to achieve impedance matching therebetween, characterized in that: an input impedance of the input-stage IC and an output impedance of the output-stage IC are first impedance and second impedance, respectively; each of at least two of the plurality of ICs is impedance matched to a corresponding one of the signal transmission paths at a matching impedance higher than a lower one of the first and second impedances.

In accordance with the above configuration, the present invention provides the following advantages:

(1) Since the load impedance of the output circuit of the IC within the semiconductor device is increased, the output current needed to obtain the same output voltage can be reduced. Further, the number of stages of the buffers needed for the output circuit can be reduced to thereby reduce the current dissipation of the IC and the entire semiconductor device.

(2) Since the operating current of the output transistor in the output circuit within the semiconductor device can be reduced, the size of the output transistor can be reduced and therefore the chip size of the IC chip can be reduced.

(3) Since the number of stages of the buffers in the output circuit of the IC within the semiconductor device can be reduced, operational speed of the IC and semiconductor device incorporating the same can be increased.

The reason why the above advantages can be obtained will be described below with reference to FIG. 10 showing a concrete example of a conventional IC that uses a bipolar transistor. Note that, in FIG. 10, the line A—A of the upper part should be coupled to the line A—A of the lower part. Here, Q6, Q7, Q11 to Q19, Q21 to Q27, Q31, Q32, and Q41 to Q43 are bipolar transistors, R7, R8, R11 to R14, R21 to R28, and R31 to R34 are resistors, GND is a ground line, and VEE is a power source line.

FIG. 10 shows the configuration of the connections between the output circuit 24*b* of the input-side IC chip 24 and the input circuit 25*a* of the intermediate IC chip 25. The input-side IC chip 24 on the preceding stage has thereon a flip-flop circuit 20 using an ECL (Emitter Coupled Logic) circuit. The output circuit 24*b* of the input-side IC chip 24 is connected through an internal transmission path 23 formed on a mounting substrate/board 28 to the input circuit 25*a* of the intermediate IC chip 25, which is connected to the IC chip on the succeeding stage. The flip-flop circuit 20 is comprised of a core section (only a slave circuit is shown in FIG. 10) of the flip-flop circuit and a two-stage buffer circuit including a differential circuit and an emitter-follower circuit configuring the output circuit 24*b*. The input circuit 25*a* of the IC chip connected to the succeeding stage is configured by an emitter-follower circuit. The characteristic impedance of the internal transmission path 23 on the mounting substrate/board 28 is 50 ohms, which is the same value of 50 ohms as the external impedance as described above. Further, the impedances of load resistors R31 and R32 on the last stage of the output circuit 24*b* are set at 50 ohms so as to achieve the impedance matching to the internal transmission paths 23 on the mounting substrate/board 28. Further, resistors R33 and R34 of 50 ohms are connected to the input circuit 25*a* on the succeeding stage so as to achieve the impedance matching to the internal transmission paths 23 on the mounting substrate/board 28.

As described above, in the conventional semiconductor device, the impedance matching between the input/output circuits of the IC chip and the transmission path on the mounting substrate/board is achieved at 50 ohms which is similar to the external impedance. Therefore, a signal reflection or signal loss does not occur in the design of the conventional semiconductor device even if a higher operational speed is employed. In FIG. 10, the last-stage load resistor R31 (R32), which is 50 ohms, and the matching resistor R33 (R34) of the input circuit 25*a* on the succeeding stage, which is 50 ohms, are connected in parallel to the transistor Q41 (Q42), whereby the output load of the flip-flop circuit 20 on the preceding stage is 25 ohms. Assuming that the required output amplitude is 0.5 Vp-p, a current of 20 mA is needed for the output drive current of the flip-flop circuit 20 on the preceding stage. Therefore, the size of each of the last stage transistors Q41 to Q43 of the output circuit 24*b* on the preceding stage needs to be large enough to drive a 20 mA current. Further, the two-stage buffer circuit is necessary in order to operate the large-sized transistor at a high speed. Moreover, the size of each of the transistor Q31 and Q32 that drive the output transistors (Q41, Q42) must be increased. In the flip-flop circuit 20 on the preceding stage shown in FIG. 10, the core section uses 2 μm×5 μm emitter size transistors and operates with a drive current of a 5 mA or less. In the output section, on the other hand, 20 mA is required and therefore 2 μm×20 μm emitter size transistors (Q41 to Q43) are required for the last stage of the output circuit. Further, in order to drive the 2 μm×20 μm emitter size transistors on the last stage of the output circuit, the two-stage buffer circuit configured by the differential circuit and emitter-follower circuit is required as a buffer circuit. Further, the emitter size of each of the transistors (Q31, Q32) that drive the large emitter size transistors (Q41, Q42) needs to be increased up to 2 μm×10 μm. Thus, there occurs that the current dissipation is increased, and that the operational speed is lowered in some cases. Further, in the case where a semiconductor device or MCM including a plurality of IC chips is formed on a mounting substrate/board, each IC output circuit needs a current dissipation of 20 mA or more, resulting in a large current dissipation in terms of the entire device.

In the semiconductor device shown in FIG. 9, the characteristic impedance of the input/output transmission path 22 needs to be set at 50 ohms and therefore the matching resistances of the input circuit of the input-side IC chip 24 and the output circuit of the output-side IC chip 26 are set at 50 ohms; however, the characteristic impedance of the internal transmission path 23 that is not connected to the coaxial cable need not be set at 50 ohms. The reason is as follows. Since the coaxial cable is generally used as a long transmission path, the characteristic impedance thereof is set at 50 ohms in order to reduce the attenuation. In the case of the internal transmission path 23 having a small length, the importance need to be attached to the attenuation constant. Assuming that the characteristic impedances of the input/output transmission path 22 and the internal transmission path are Zex and Zint respectively, and that the characteristic impedance of the internal transmission path 23 is set so that $Zint = \alpha Zex (\alpha > 1)$, each of the matching impedances of the output circuit of the input-side IC chip 24 and the input circuit of the intermediate IC chip 25 is $\alpha Zex$, with the result that the load impedance of the output transistor of the input-side IC chip 24 is $\alpha Zex/2$. Assuming that the input signal amplitude needed to drive the intermediate IC chip 25 on the next stage is Vin, current I needed in the case of the conventional circuit is represented by the following equation:

$$I = Vin/2\alpha Zex$$

whereas, in the case of the semiconductor device according to the present invention, the required current I is represented by the following equation:

$$I - Vin/2Zint = Vin/2\alpha Zex$$

In this case, $1/\alpha$ is enough to drive the intermediate IC chip 25. Therefore, it is possible to reduce the size of the output transistor and thereby to reduce the number of stages and the size of the buffer circuit that drives the output transistor. Although the above advantages of the present invention can be obtained so long as $\alpha>1$, it is preferable that $2<\alpha<10$ be satisfied. The reason is that the advantage obtained by the present invention is relatively limited if $\alpha$ is not more than 2 and it may be impossible to ignore other adverse effects such as an increase in signal loss or signal delay if $\alpha$ is not less than 10.

BEST MODE FOR CARRYING OUT THE INVENTION

Figure 1A:
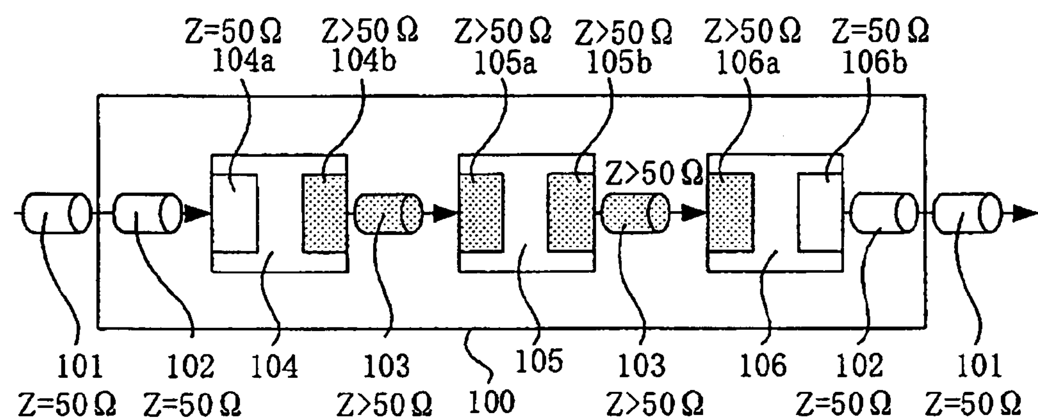
FIG. 1A is a block diagram exemplifying a semiconductor device, according to the present invention.

FIG. 1A is a block diagram schematically exemplifying the configuration of the semiconductor device according to the present invention. As shown in the same drawing, a semiconductor device 100 includes a plurality of ICs disposed therein, including an input-stage IC 104, an output-stage IC 106, and one or more intermediate-stage IC 105, which are cascaded by signal transmission paths. The signal transmission paths include input/output transmission paths 102 connected to external transmission paths 101 and one or more internal transmission paths 103 each connecting adjacent two of the ICs. Although the characteristic impedance Z of the input/output transmission path 102 is set at 50 ohms in order to achieve the impedance matching to the characteristic impedance Z (Z=50 ohms) of the external transmission path 103, the characteristic impedance Z of the internal transmission path 103 is set at more than 50 ohms (e.g., Z=200 ohms). The input-side IC 104 or output-side IC 106 is disposed between the external transmission path 101 and the internal transmission path 103, and the intermediate IC 105 is disposed between two of the internal transmission paths 103. The impedances of the input/output circuits of each of the semiconductor ICs are set to match the characteristic impedances of the transmission paths connected to the respective input/output circuits. More specifically, the input impedance of an input circuit 104*a* of the input-side IC 104 is set at 50 ohms, the output impedance of an output circuit 104*b* of the input-side IC 104 is set at more than 50 ohms, the input impedance of an input circuit 105*a* and the output impedance of an output circuit 105*b* of the intermediate IC 105 are set at more ta 50 ohms, the input impedance of an input circuit 106*a* of the output-side IC 106 is set at more than 50 ohms, and the output impedance of an output circuit 106*b* of the output-side IC 106 is set at 50 ohms.

The semiconductor device 100 may have a modular configuration such as an MCM. The mounting substrate/board, on which the transmission paths are formed and the semiconductor ICs are mounted, may be a semiconductor substrate, an inorganic board made of ceramic, or a resin board made of glass epoxy. Further, the mounting substrate/board may be an insulator-coated metal board. In the case where the mounting substrate/board is a semiconductor substrate, devices such as transistors may be formed within the substrate. The transmission paths may be formed directly on a package, and the semiconductor integrated circuits may be mounted directly on the package (mounting substrate/board may serve also as a package).

Although not shown in the semiconductor device of FIG. 1, interconnections other than the transmission path, such as a power source line, are actually formed on the mounting substrate/board. More specifically, as shown in FIG. 2, interconnections 107 other than transmission paths, such as a power source line, a ground line, and a control line are formed, if needed in addition to the input/output transmission paths 102 and internal transmission paths 103, on a mounting substrate/board 100*a* having thereon the ICs 104 to 106. However, the present invention is not focused on the interconnections other than the transmission paths, and is entirely focused on the transmission paths.

The output signals of the input-side IC 104 and intermediate IC 105 may be input to a plurality of ICs via transmission paths having branches. Further, passive components such as a capacitor or an inductor, or a thin-film active component may be formed on the mounting substrate/board. Further, an active component or passive component other than a semiconductor integrated circuit may be separately mounted on the mounting substrate/board. Each of the ICs 104 to 106 may be a bare chip IC or a packaged IC. Further, an MCM structure in which a plurality of IC chips are mounted may be adopted.

The characteristic impedances of all the internal transmission paths 103 need not be set at a fixed value. For example, the characteristic impedances of some of internal transmission paths 103 may be 100 ohms, and the characteristic impedances of the other internal transmission paths 103 may be 200 ohms. Further, the characteristic impedances of all the internal transmission paths 103 need not be more than the characteristic impedances of the input/output transmission paths. Only the characteristic impedances of some of the internal transmission paths 103 may be set at not less than 50 ohms. The advantages of the present invention may be obtained when at least the characteristic impedances of some of the internal transmission paths 103 are set at more than the characteristic impedance of the input/output transmission paths. However, the maximum advantage will be obtained when the characteristic impedances of all the internal transmission paths 103 are larger than the characteristic impedance of the input/output transmission paths. In terms of design man-hours or easiness of manufacturing, it is most desirable to set the characteristic impedances of all the internal transmission paths 103 at a fixed value.

It is most preferable to use a coaxial cable as the external transmission path 101, in terms of signal transmission quality, easiness of connection, and reduction in design man-hours.

Although the transmission rate or frequency of the signal used in the semiconductor device according to the present invention is not particularly limited, the present invention is effectively applied to the case where the signal transmission rate is higher than 1 Gbps or signal frequency is higher than 800 MHz, in which the problem of impedance matching is of significant importance in view of reduction of the signal reflection. In particular, when a signal transfer rate exceeds 2.4 Gbps or a signal frequency exceeds 1 GHz, the problem of impedance matching becomes more serious, with the result that the advantages of the present invention become more significant.

Figure 1B:
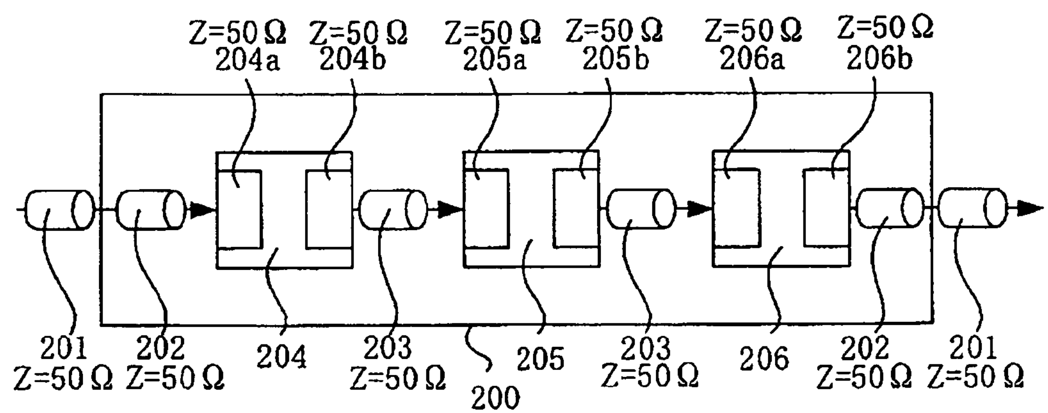
FIG. 1B is a block diagram exemplifying a conventional semiconductor device.
Figure 2:
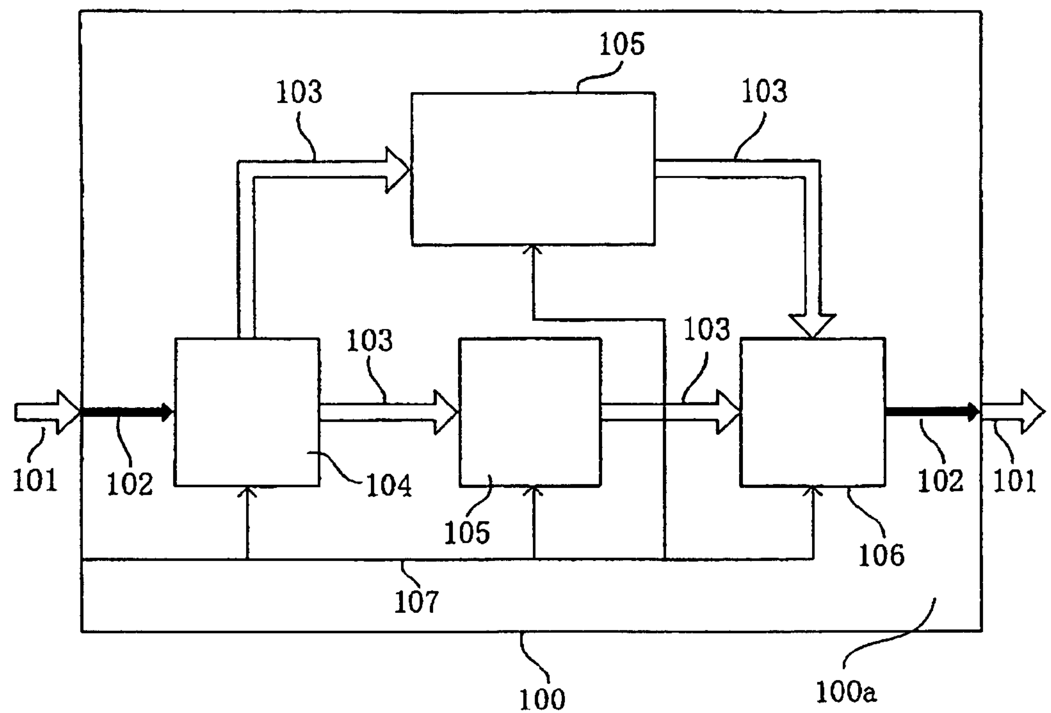
FIG. 2 is a block diagram schematically exemplifying the configuration of the semiconductor device according to the present invention which include interconnections other than transmission paths.

For comparison with the semiconductor device 100, a conventional semiconductor device is shown in FIG. 1B. In FIG. 1B, reference numerals for the components include least significant two digits which are common to the least significant two digits of the reference numerals used for the corresponding components in the semiconductor device of FIG. 1A, and duplicated description of these components will be omitted herein. In the conventional technique, the characteristic impedances of all the transmission paths are set at the same value of 50 ohms as the characteristic impedance of the external transmission path, and input/output impedances of all the input/output circuits of respective ICs are set at 50 ohms.

FIRST EMBODIMENT

Figure 3:
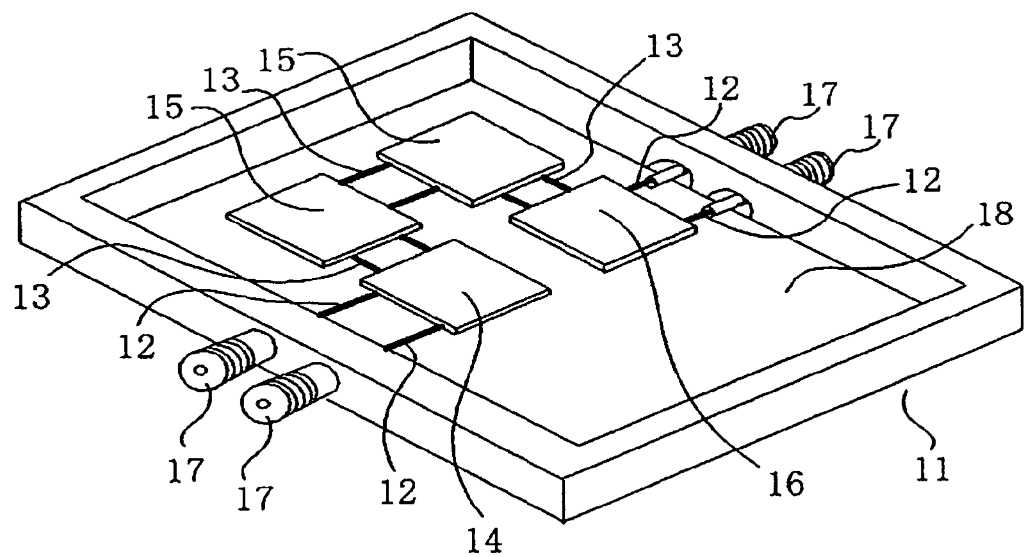
FIG. 3 is a perspective view of a semiconductor device according to a first embodiment of the present invention.
Figure 9:
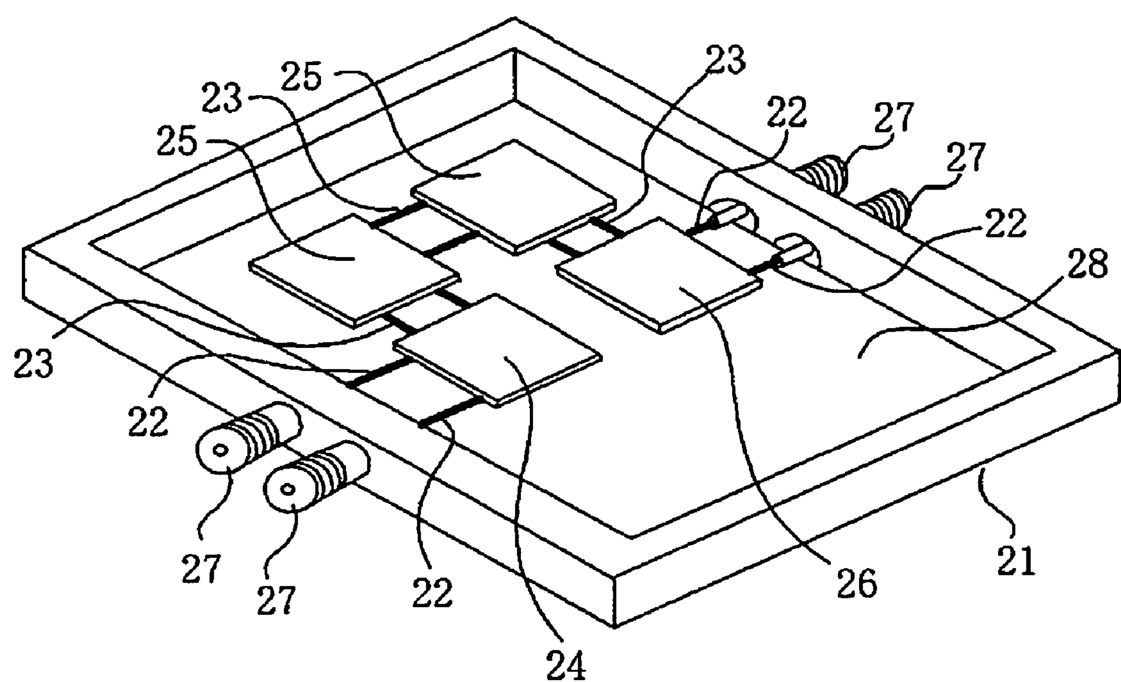
FIG. 9 is a perspective view of a conventional semiconductor device.
Figure 10:
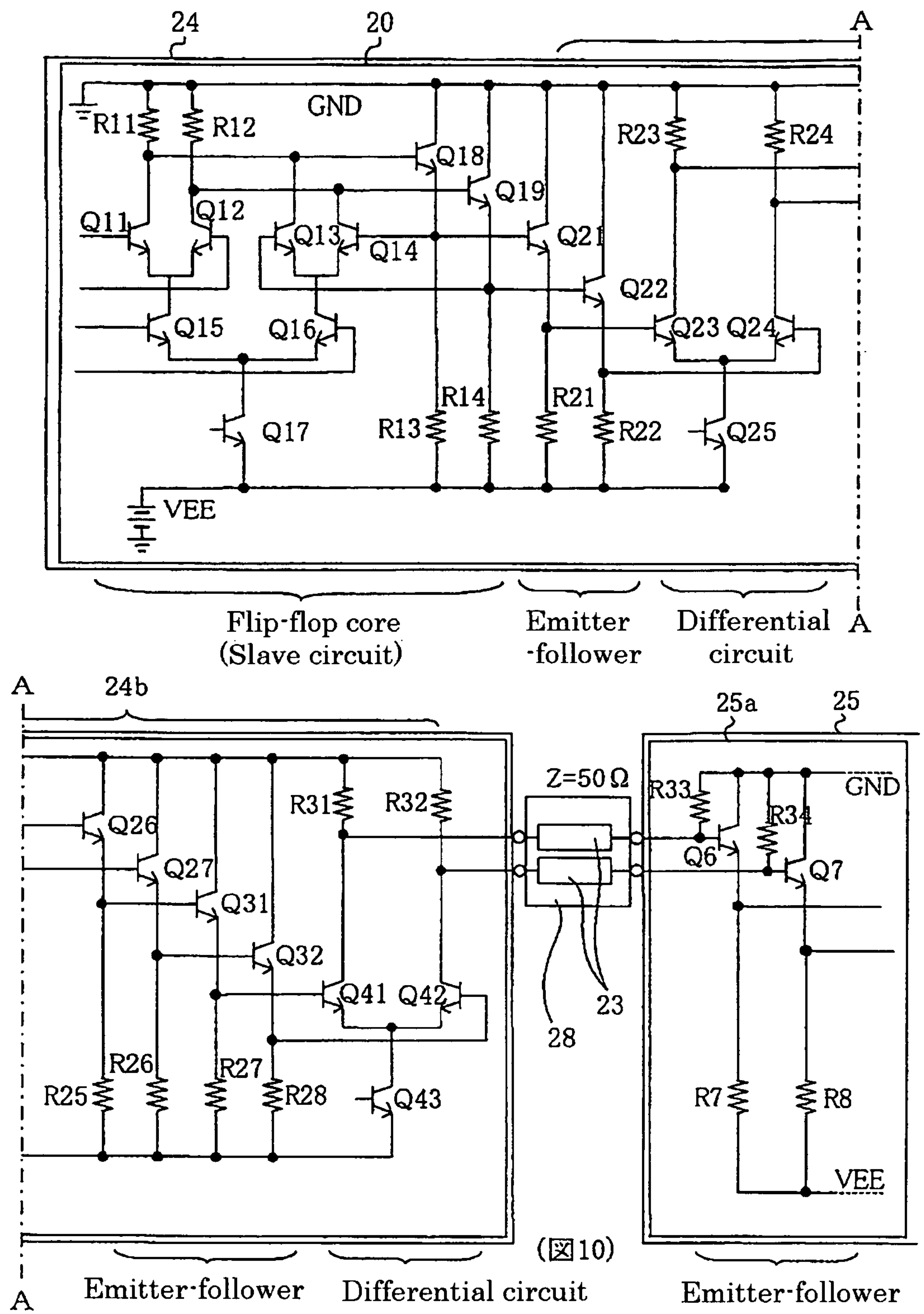
FIG. 10 is a circuit diagram of the conventional semiconductor device.

FIG. 3 is a perspective view showing the configuration of a semiconductor device according a first embodiment of the present invention. In FIG. 3, reference numerals for the components include the least significant digit which is common to the least significant digit of the reference numerals for the corresponding components in the conventional semiconductor device of FIG. 9, and duplicated description of these components will be omitted herein. In the present embodiment, the characteristic impedances of the input/output transmission paths 12 that are connected to respective external circuits through the connectors 17 are set at the same value of 50 ohms as the external impedance; whereas the characteristic impedances of the internal transmission paths 13 that connect together a plurality of IC chips are set at 200 ohms, which is higher than the external impedance. The input impedance of the input circuit of the input-side IC chip 14 and the output impedance of the output circuit of the output-side IC chip 16 are set at 50 ohms so as to match the characteristic impedances of the input/output transmission paths 12; whereas the output impedance of the input-side IC chip 14, the input impedance of the output-side IC chip 16, and the input/output impedances of the intermediate IC chip 15 are set at 200 ohms, which is higher than the external impedance. That is, the input impedance of the input-side IC chip 14 that incorporates therein the input circuits of the entire semiconductor device 11 is set at 50 ohms and the output impedance thereof is set at 200 ohms. On the other hand, the input impedance of the output-side IC chip 16 that incorporates therein the output circuits of the entire semiconductor device is set at 200 ohms and the output impedance thereof is set at 50 ohms.

Figure 4:
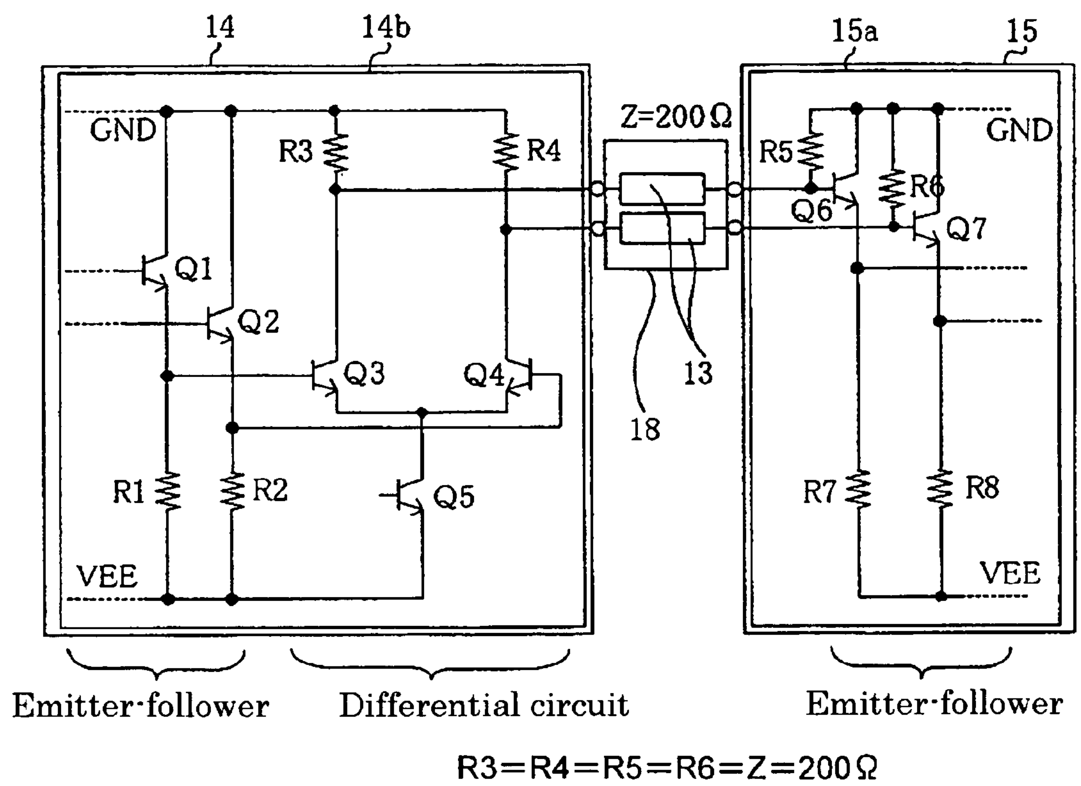
FIG. 4 is a circuit diagram of the semiconductor device according to the first embodiment of the present invention.

With reference to FIG. 4, the configuration of the connections between the IC chips within the semiconductor device will now be described. Here, connections between an output circuit 14*b* of the input-side IC chip 14 and an input circuit 15*a* of the intermediate IC chip 15 is shown as an example, wherein the input-side and intermediate IC chips include therein bipolar transistors. In FIG. 4, Q1 to Q7 are bipolar transistors, R1 to R8 are resistors, GND is a ground line, and VEE is a power source line. The output circuit 14*b* of the input-side IC chip 14 is configured by an emitter-follower circuit and a differential circuit. The load resistors R3 and R4 of the last stage are set at 200 ohms. The input circuit 15*a* of the intermediate IC chip 15, which is connected to the input-side IC chip 14 as the IC chip of the succeeding stage, is configured by an emitter-follower circuit. The matching resistors R5 and R6 of 200 ohms are set in the input section of the intermediate IC chip 15. The output circuit 14*b* of the input-side IC chip 14 on the preceding stage and the input circuit 15*a* of the intermediate IC chip 15 on the succeeding stage are connected to each other through the internal transmission paths 13 each formed on a mounting substrate/board 18 and having a characteristic impedance of 200 ohms. Thus, impedance matching is achieved. The load resistors R3 and R4 of the preceding stage, which are 200 ohms, and the matching resistors R5 and R6 of the succeeding-stage input circuit 15*a*, which are 200 ohms, allow the output load of the output circuit 14*b* on the preceding stage to assume 100 ohms. Assuming that the output amplitude is 0.5 Vp-p, the output drive current needed for the output circuit 14*b* on the preceding stage is 5 mA, thereby reducing the current dissipation.

Further, in the case where a semiconductor device or MCM having a plurality of IC chips is formed on the mounting substrate/board, the current dissipation of 20 mA, which has been required for respective IC output circuits in the prior art, may be reduced to ⅕ in the present embodiment. Thus, the current dissipation of the entire semiconductor device is significantly reduced.

Although the input matching resistors R5 and R6 are connected between the base of the transistor Q6 and ground and between the base of the transistor Q7 and ground, respectively, in the present embodiment, the input matching resistor may be connected between the base and the power source line depending on the circuit scheme.

SECOND EMBODIMENT

Figure 5:
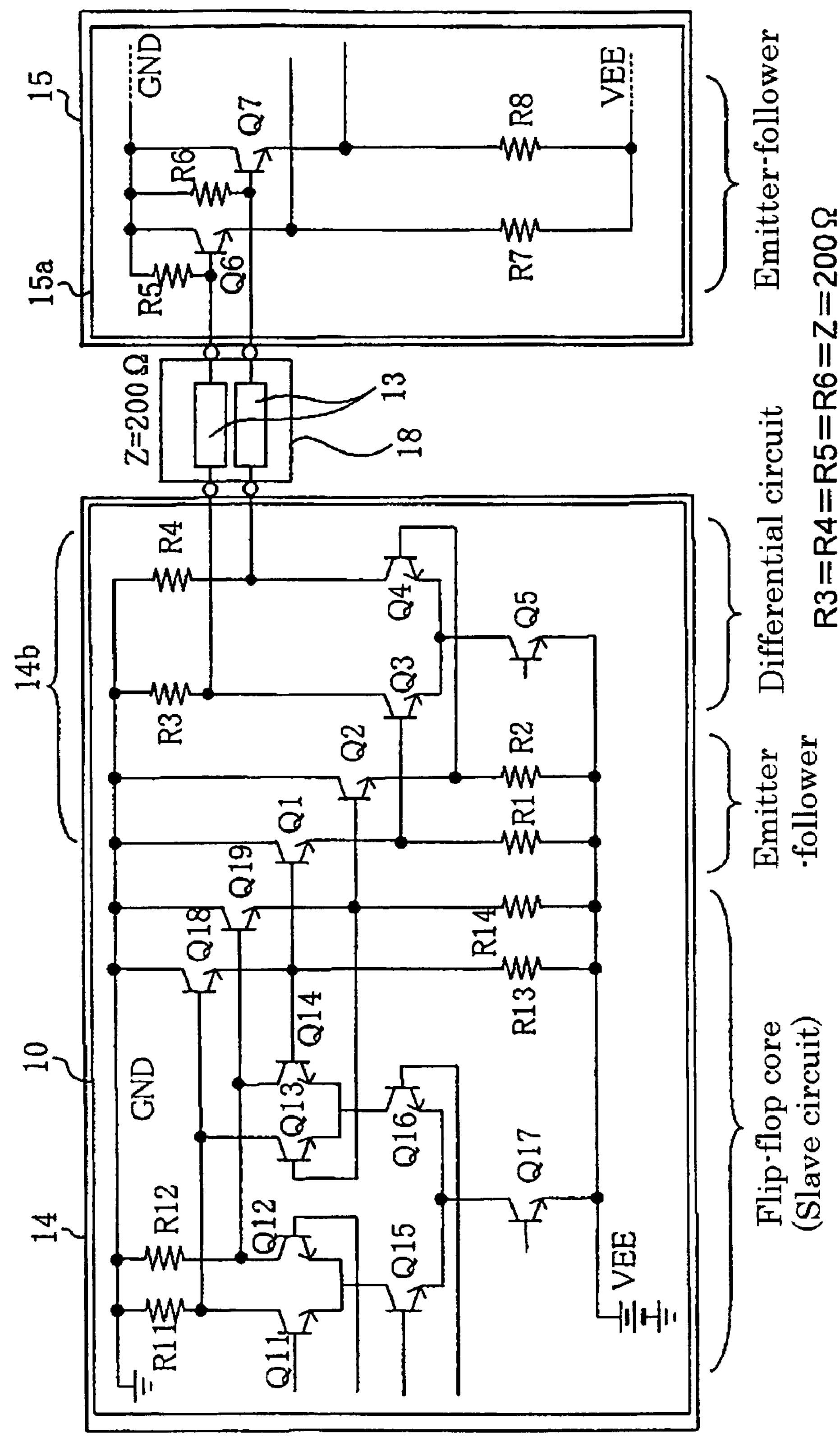
FIG. 5 is a circuit diagram of a semiconductor device according to a second embodiment of the present invention.

FIG. 5 shows a part of the circuit configuration of a semiconductor device according to a second embodiment of the present invention. The entire configuration of the semiconductor device according to the second embodiment is similar to that of the second embodiment shown in FIG. 3. More specifically, FIG. 5 shows the configuration of connections between the input-side IC chip 14 and the intermediate IC chip 15. In FIG. 5, Q1 to Q7 and Q11 to Q19 are bipolar transistors, R1 to R8 and R11 to R14 are resistors, GND is a ground line, and VEE is a power source line. A flip-flop circuit 10 using an ECL basic circuit is mounted on the input-side IC chip 14 on the preceding stage. The output circuit 14*b* of the input-side IC chip 14 and input circuit 15*a* of the intermediate IC chip 15 on the succeeding stage are connected to each other through the internal transmission paths 13 formed on a mounting substrate/board 18. The flip-flop circuit 10 is configured by a core section (only a slave circuit is shown in FIG. 5) of the flip-flop circuit and a one-stage buffer circuit including an emitter-follower circuit and a differential circuit. The load resistors R3 and R4 on the last stage are set at 200 ohms, respectively. The input circuit 15*a* of the intermediate IC chip 15, which is connected to the output circuit 14*b* of the input-side IC chip 14 as the IC chip on the succeeding stage, is configured by an emitter-follower circuit. The matching resistors R5 and R6 of 200 ohms are set in the input section. The output circuit 14*b* of the flip-flop circuit 10 on the preceding stage and the input circuit 15*a* of the intermediate IC chip 15 on the succeeding stage are connected to each other through the internal transmission paths 13 each formed on the mounting substrate/board 18 and having a characteristic impedance of 200 ohms. Thus, impedance matching is achieved. The load resistors R3 and R4 on the last stage, which are 200 ohms, and the matching resistors R5 and R6 of the succeeding-stage input circuit 15*a*, which are 200 ohms, allow the output load of the flip-flop circuit 10 on the preceding stage to assume 100 ohms. Assuming that the output amplitude is 0.5 Vp-p, the output drive current needed for the output circuit of the flip-flop circuit 10 on the preceding stage is 5 mA, thereby reducing the current dissipation. In the conventional case, an output drive current of 20 mA has been required and therefore the last stage of the output circuit has been configured by transistors each having a large emitter size of 2 μm×20 μm. On the other hand, in the present invention, the required output drive current is reduced to 5 mA, whereby the last stage of the output circuit may be configured by transistors each having the same emitter size of 2 μm×5 μm as the emitter size of transistor to be used in the core section of the flip-flop circuit. For the configuration of ICs, there was a need to drive large-sized transistors on the last stage, which requires a two-stage buffer circuit including a differential circuit or emitter-follower circuit; whereas, in the present invention, the sizes of the transistors on the last stage are reduced, whereby a one-stage buffer circuit is enough for the driving. Thus, it is possible to operate the IC at a higher speed by reducing the current dissipation of the entire IC and the number of buffer circuits.

THIRD EMBODIMENT

Figure 6:
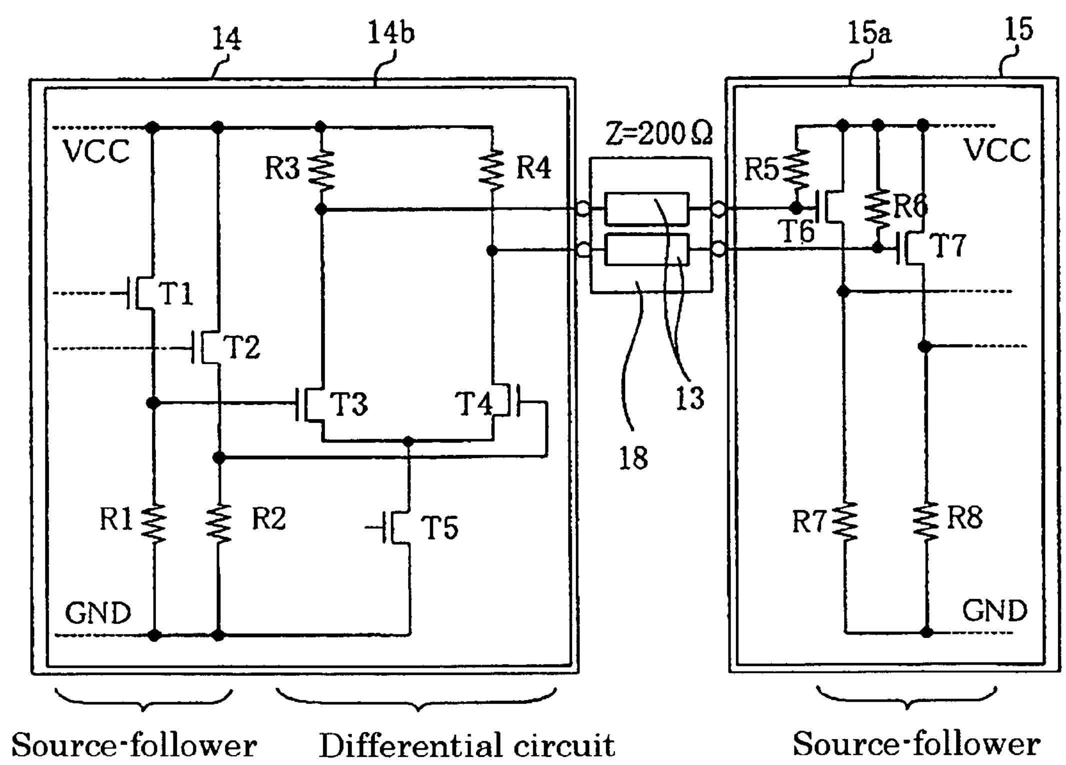
FIG. 6 is a circuit diagram of a semiconductor device according to a third embodiment of the present invention.

FIG. 6 shows a part of the circuit configuration of a semiconductor device according to a third embodiment of the present invention. The entire configuration of the semiconductor device according to the third embodiment is similar to that of the second embodiment shown in FIG. 3. More specifically, FIG. 6 shows the configuration of connections between the input-side IC chip 14 and the intermediate IC chip 15. In FIG. 6, T1 to T7 are field-effect transistors, R1 to R8 are resistors, VCC is a power source line, and GND is a ground line. The output circuit 14*b* of the input-side IC chip 14 is configured by a source-follower circuit and a differential circuit. Each of the load resistors R3 and R4 on the last stage is set at 200 ohms. The input circuit 15*a* of the intermediate IC chip 15, which is connected to the output circuit 14*b* of the input-side IC chip 14 as the IC chip on the succeeding stage, is configured by a source-follower t. The matching resistors R5 and R6 of 200 ohms are set in the input section. The output circuit 14*b* of the input-side IC chip 14 on the preceding stage and the input circuit 15*a* of the intermediate IC chip 15 on the succeeding stage are connected to each other through the internal transmission paths 13 each formed on a mounting substrate/board 18 and having a characteristic impedance of 200 ohms. Thus, impedance matching is achieved. The load resistors R3 and R4 on the preceding stage, which are 200 ohms, and the matching resistors R1 and R6 of the succeeding-stage input circuit 15*a*, which are 200 ohms, allow the output load of the output circuit 14*b* on the preceding stage to assume 100 ohms.

Also in the case where the semiconductor integrated circuit is configured by field-effect transistors, reductions in the output current of the output transistors and in the size thereof can be realized.

The field-effect transistors T1 to T7 may be MOS type transistors formed on a Si substrate or MES type transistors formed on a GaAs substrate.

Although the input matching resistors R5 and R6 are connected between the source of the transistor T6 and the power source line and between the source of the transistor T7 and the power source line, respectively, in the present embodiment, the input matching resistor may be connected between the source and ground depending on the circuit scheme.

FOURTH EMBODIMENT

Figure 7:
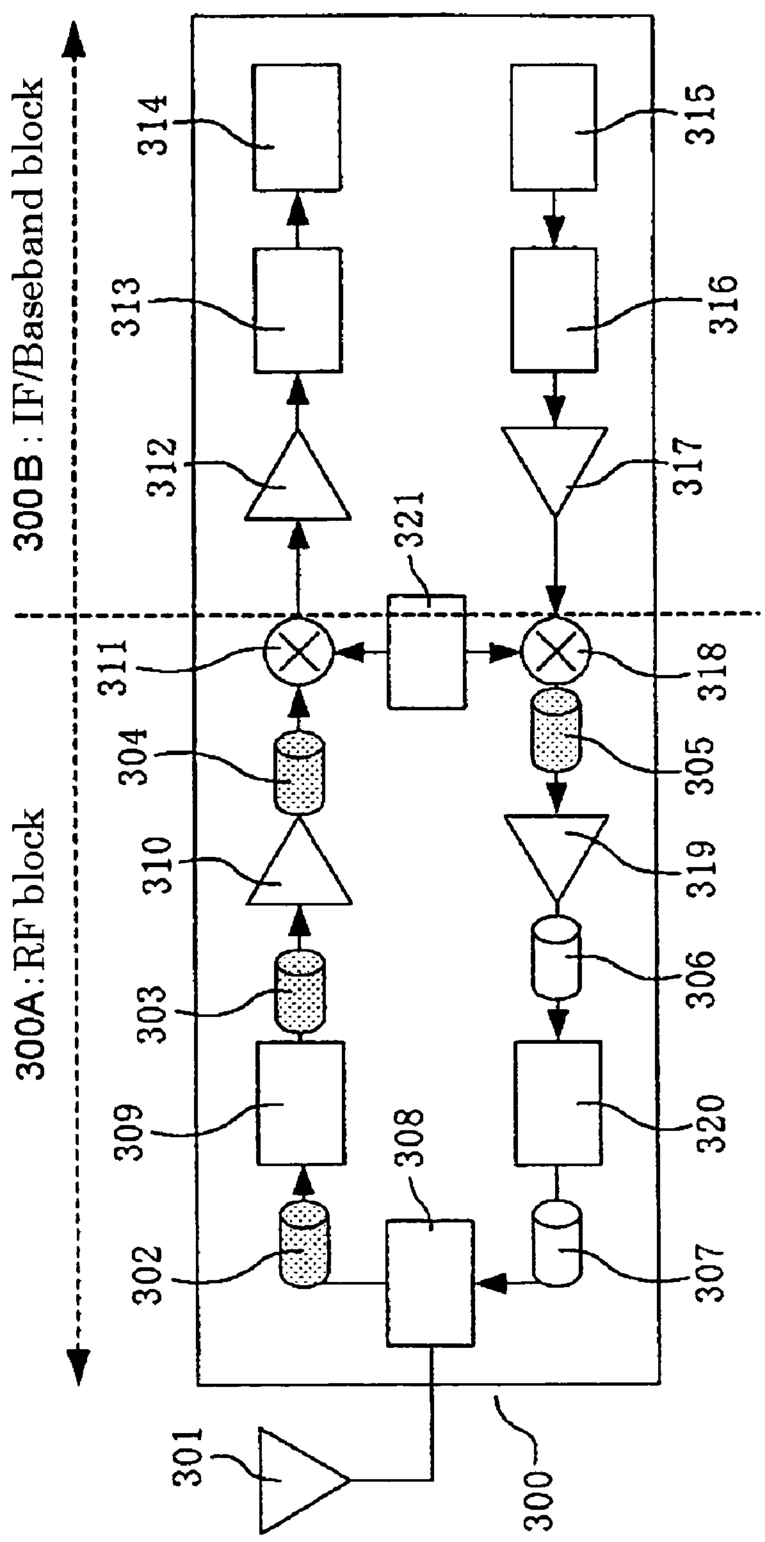
FIG. 7 is a block diagram of a semiconductor device according to a fourth embodiment of the present invention.

FIG. 7 shows the circuit configuration of a semiconductor device according to a fourth embodiment of the present invention. The fourth embodiment shows the case where the present invention is applied to a mobile phone or a wireless LAN terminal. A mobile phone, such as a PDC personal digital cellular) or PHS (personal handyphone system), or a wireless LAN terminal, such as a Bluetooth, is generally configured by a semiconductor device 300 including a transmitting circuit and a receiving circuit, such as shown in FIG. 7. The semiconductor device 300 is configured by an RF block 300A and an IF/Baseband block 300B. The RF block 300A includes an antenna switch 308, a low-noise amplifier 310, a power amplifier 319, mixers 311, 318 and the like and operates for processing of a high-frequency signal. The IF/Baseband block 300B includes a variable-gain amplifier 312, a quadrature demodulator 313, an A/D converter 314, a D/A converter 315, a quadrature modulator 316, a driver amplifier 317 and the like. In the PDC portable phone, the RF block operates for processing of a signal of 800 MHz and the signal is changed to 100 to 200 MHz through the mixer 311. In the Bluetooth the RF block operates for processing of a signal of 2.4 GHz and the signal is changed to 3 MHz through the mixer 311. In the receiving circuit of the RF block 300A, an RF receiving signal received through the antenna 301 is passed through the antenna switch 308, band-pass filter 309, and low-noise amplifier 310, applied to the mixer 311, mixed with a local oscillating signal from a local oscillator, and converted into an IF receiving signal. In the transmitting circuit of the RF block 300A, an IF transmission signal is mixed with a local oscillating signal from the local oscillator 321 by the mixer 318 and converted into an RF transmission signal. After being passed through the power amplifier 319, band-pass filter 320, antenna switch 308, and antenna 301, the RF transmission signal is delivered. The input/output of the IC in the RF block 300A described above has conventionally been effected through a transmission path formed on a printed-circuit board and having an impedance of 50 ohms. In the case of the present invention, on the receiving circuit side, the impedances of a transmission path 302 between the antenna switch 308 and the band-pass filter 309, transmission path 303 between the band-pass filter 309 and the low-noise amplifier 310, and transmission path 304 between the low-noise amplifier 310 and the mixer 311 are set at an impedance higher than 50 ohms (e.g., 100 ohms). On the transmitting circuit side, the impedance of a transmission path 305 between the mixer 318 and power amplifier 319 is set at an impedance higher than 50 ohms (e.g., 100 ohms), and the impedances of a transmission path 306 between the power amplifier 319 and the band-pass filter 320, and transmission path 307 between the band-pass filter 320 and antenna switch 308 are set at 50 ohms. Therefore, on the receiving circuit side, the receiving-side output of the antenna switch 308, the input/output of the band-pass filter

309, the input/output of the low-noise amplifier 310, and the input of the mixer 311 are matched to an impedance higher than 50 ohms (e.g., 100 ohms). Similarly, on the transmitting circuit side, the output of the mixer 318 and input of the power amplifier 319 are matched to an impedance higher than 50 ohms (e.g., 100 ohms). On the transmitting circuit side, the output of the power amplifier 319, the input/output of the band-pass filter 320, and the transmitting-side input of the antenna switch 308 are matched to an impedance of 50 ohms.

As described above, it is possible to reduce the current dissipation by setting the input/output of the ICs at an impedance higher than 50 ohms to allow the impedances between the ICs to be matched.

Although the output of the antenna switch, the input/output of the low-noise amplifier, the input of the mixer, and the like are matched to an impedance higher than 50 ohms in the above embodiment, the inputs or outputs of other ICs, for example, the input/output of the band-pass filter 320 may be matched to an impedance higher than 50 ohms.

FIFTH EMBODIMENT

Figure 8:
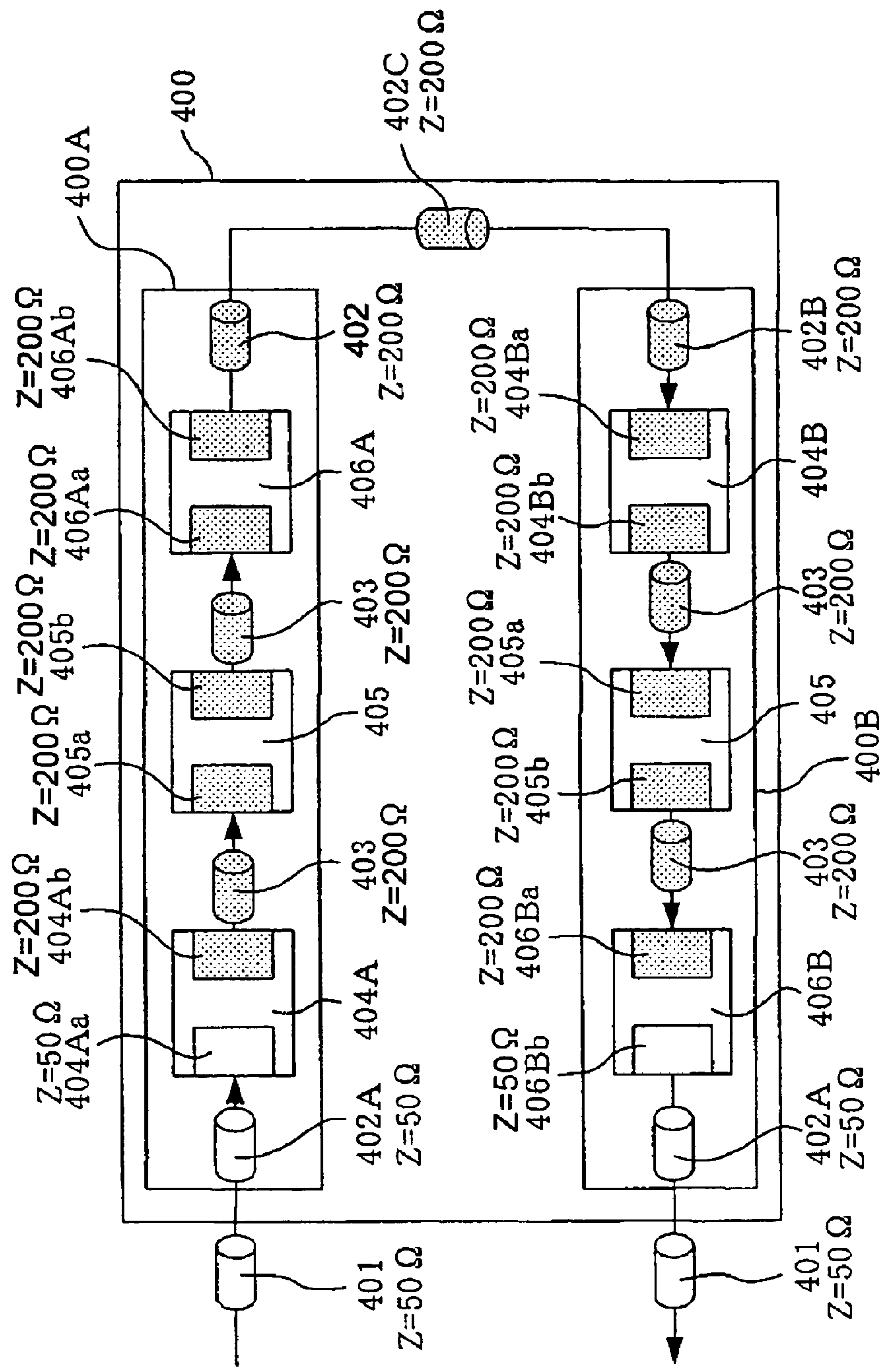
FIG. 8 is a block diagram of a semiconductor device according to a fifth embodiment of the present invention.

FIG. 8 shows the configuration of a semiconductor device according to a fifth embodiment of the present invention. In a semiconductor device 400 according to the fifth embodiment, an MCM 400A and an MCM 400B are mounted on a common mounting substrate/board. The two MCMs are connected to each other through an inter-MCM transmission path 402C formed on the same mounting substrate/board. On the MCM 400A to which a signal is input through an external transmission path 401, an input-side IC 404A, an intermediate IC 405 and an output-side IC 406A are mounted, whereas input/output transmission paths 402A, 402B and an internal transmission path 403 are formed thereon. On the MCM 400B, an input-side IC 404B, an intermediate IC 405 and an output-side IC 406B are mounted, whereas input/output transmission paths 402A, 402B and an internal transmission path 403 are formed thereon. The MCM 400B outputs a signal through an external transmission path 401. Although the characteristic impedance of the input/output transmission path 402A is set at the same value of 50 ohms as the characteristic impedance of the external transmission path, the characteristic impedances of the input/output transmission path 402B, the internal transmission path 403, and the transmission path 402C between MCMs are set at 200 ohms. Therefore, an input circuit 404Aa of the input-side IC 404A and output circuit 406Bb of the output-side IC 406B are impedance matched to 50 ohms; whereas an output circuit 404Ab of the input-side IC 404A, the input circuit 405*a* and output circuit 405*b* of the intermediate IC 405, the input circuit 406Aa and output circuit 406Ab of the output-side IC 406A, the input circuit 404Ba and output circuit 404Bb of the input-side IC 404B, and the input circuit 406Ba of the output-side IC 406B are impedance matched to 200 ohms.

Here, attention is paid to the MCM 400A and MCM 400B and it is found that the characteristic impedances of the input/output transmission paths 402A and 402B are set at different values from each other in these semiconductor devices. However, the present invention includes the semiconductor device 400 as well as semiconductor devices represented by the MCM 400A and MCM 400B. In other words, a semiconductor device in which the characteristic impedances of the input-side transmission path and the output-side transmission path we set at different values from each other is also included in the scope of the present invention. According to the present invention, in the case where the characteristic impedances of the input-side transmission path and the output-side transmission path are set at different values from each other, the characteristic impedance of at least one internal transmission path is set higher than that of the input/output transmission path having a lower characteristic impedance.

The signal transmission paths that connect together internal ICs may have different characteristic impedances each corresponding to one of a plurality of groups of the signal transmission paths. In this case, the input or output impedance of each of the ICs is so selected as to match the characteristic impedance of the corresponding signal transmission path.

Although the preferred embodiments of the present invention have thus been described heretofore, it is to be understood that the present invention is not limited to the above-described embodiments, and various modifications may be made without departing from the spirit and scope of the invention. For example, the case where the present invention is applied to a flip-flop circuit used as the output section of the IC on the preceding stage has been described in the above embodiments. Alternatively, however, the present invention is applicable to other circuits such as an amplifier circuit.

The invention claimed is:

1. A semiconductor device comprising a plurality of IC elements including at least an input stage IC element and an output-stage IC element and mounted on a common mounting substrate/board, and signal transmission paths that connect each two of said plurality of IC elements to achieve impedance matching therebetween, wherein that:

an input impedance of said input-stage IC element and an output impedance of said output-stage IC element are equal to a first impedance; and each of at least two of said plurality of IC elements are impedance-matched to a corresponding one of said signal transmission paths at a matching impedance which is higher than said first impedance.

2. The semiconductor device according to claim 1, wherein said plurality of IC elements include a plurality of IC element groups, each of which is mounted on a common mounting substrate/board.

3. The semiconductor device according to claim 1, wherein said matching impedance differs between two of said signal transmission paths.

4. The semiconductor device according to claim 1, wherein at least one of said plurality of IC elements has a resistance element for said impedance matching in said input circuit and/or said output circuit.

5. The semiconductor device according to claim 4, wherein said output circuit is a differential circuit.

6. The semiconductor device according to claim 4, wherein said input circuit is an emitter-follower circuit, and said resistance element is connected between a base and a ground, or between a base and a power source.

7. The semiconductor device according to claim 4, wherein said input circuit is a source-follower circuit, and said resistance element is connected between a gate and a ground, or between a gate and a power source.

8. The semiconductor device according to claim 1, wherein at least one of said IC elements includes an ECL circuit.

9. The semiconductor device according to claim 1, wherein at least one of said IC elements is a bare chip.

10. The semiconductor device according to claim 1, wherein at least one of an input circuit of said input-stage IC element and an output circuit of said output-stage IC element is connected to an external circuit through a coaxial cable.

11. The semiconductor device according to claim 1, wherein a signal to be input to said input-stage IC element has a transmission rate not less than 1 Gbps or a frequency not less than 800 MHz.

12. The semiconductor device according to claim 1, wherein said matching impedance is not more than ten times said first impedance.

13. The semiconductor device according to claim 1, wherein said matching impedance is not less than double said first impedance.

14. A semiconductor device comprising a plurality of IC elements including at least an input-stage IC element and an output-stage IC element and mounted on a common mounting substrate/board, and signal transmission paths that connect each adjacent two of said plurality of IC elements to achieve impedance matching therebetween, wherein:

an input impedance of said input-stage IC element and an output impedance of said output-stage IC element are first impedance and second impedance, respectively; and each of at least two of said plurality of IC elements is impedance matched to a corresponding one of said signal transmission paths at a matching impedance higher than a lower one of said first and second impedances, wherein said matching impedance differs between two of said signal transmission paths.

15. The semiconductor device according to claim 14, wherein said plurality of IC elements include a plurality of IC element groups, each of which is mounted on a common mounting substrate/board.

16. The semiconductor device according to claim 14, wherein at least one of said plurality of IC elements has a resistance element for said impedance matching in said input circuit and/or said output circuit.

17. The semiconductor device according to claim 16, wherein said output circuit is a differential circuit.

18. The semiconductor device according to claim 16, wherein said input circuit is an emitter-follower circuit, and said resistance element is connected between a base and a ground, or between a base and a power source.

19. The semiconductor device according to claim 16, wherein said input circuit is a source-follower circuit, and said resistance element is connected between a gate and a ground, or between a gate and a power source.

20. The semiconductor device according to claim 14, wherein at least one of said IC elements includes an ECL circuit.

21. The semiconductor device according to claim 14, wherein at least one of said IC elements is a bare chip.

22. The semiconductor device according to claim 14, wherein at least one of an input circuit of said input-stage IC element and an output circuit of said output-stage IC element is connected to an external circuit through a coaxial cable.

23. The semiconductor device according to claim 14, wherein a signal to be input to said input-stage IC element has a transmission rate not less than 1 Gbps or a frequency not less than 800 MHz.

24. The semiconductor device according to claim 14, wherein said matching impedance is not more than ten times said first impedance.

25. The semiconductor device according to claim 14, wherein said matching impedance is not less than double said first impedance.

* * * * *